(12) United States Patent
Kim

(10) Patent No.: US 7,829,861 B2
(45) Date of Patent: Nov. 9, 2010

(54) DIGITAL X-RAY DETECTOR AND FABRICATION METHOD THEREOF

(75) Inventor: Ju-Han Kim, Daegu (KR)

(73) Assignee: Display Co., Ltd., Seoul (KR)

( * ) Notice: Subject to any disclaimer, the term of this patent is extended or adjusted under 35 U.S.C. 154(b) by 190 days.

(21) Appl. No.: 12/289,466

(22) Filed: Oct. 28, 2008

(65) Prior Publication Data

US 2009/0146147 A1    Jun. 11, 2009

(30) Foreign Application Priority Data

Dec. 7, 2007   (KR) ...................... 10-2007-0127192

(51) Int. Cl.
*H01L 27/146*   (2006.01)

(52) U.S. Cl. ................................. 250/370.09

(58) Field of Classification Search ........... 250/370.01–370.15; 378/98.8; 257/59, 443, 257/444

See application file for complete search history.

(56) References Cited

U.S. PATENT DOCUMENTS

| | | | | |
|---|---|---|---|---|
| 5,132,541 | A * | 7/1992 | Conrads et al. | 250/370.01 |
| 5,396,072 | A * | 3/1995 | Schiebel et al. | 250/370.09 |
| 5,869,837 | A * | 2/1999 | Huang | 250/370.09 |
| 6,020,590 | A * | 2/2000 | Aggas et al. | 250/370.09 |
| 6,060,714 | A * | 5/2000 | Zhong et al. | 250/370.09 |
| 6,310,372 | B1 | 10/2001 | Katayama et al. | 257/291 |
| 6,323,490 | B1 * | 11/2001 | Ikeda et al. | 250/370.09 |
| 6,403,965 | B1 * | 6/2002 | Ikeda et al. | 250/370.09 |
| 6,407,393 | B1 * | 6/2002 | Kim et al. | 250/370.09 |
| 6,423,973 | B2 * | 7/2002 | Choo et al. | 250/370.09 |
| 6,462,344 | B1 * | 10/2002 | Joo et al. | 250/370.09 |
| 6,740,884 | B2 * | 5/2004 | Lee et al. | 250/370.08 |
| 6,906,331 | B2 * | 6/2005 | Choo et al. | 250/370.09 |
| 7,259,037 | B2 * | 8/2007 | Shih | 438/55 |
| 7,368,315 | B2 * | 5/2008 | Moon | 438/98 |
| 7,402,810 | B2 * | 7/2008 | Kim | 250/370.09 |
| 7,435,968 | B2 * | 10/2008 | Watanabe et al. | 250/370.14 |
| 7,547,890 | B2 * | 6/2009 | Watanabe et al. | 250/370.08 |
| 2001/0013577 | A1 * | 8/2001 | Choo et al. | 250/370.09 |
| 2002/0084419 | A1 * | 7/2002 | Choo et al. | 250/370.01 |
| 2002/0145116 | A1 * | 10/2002 | Choo et al. | 250/370.09 |
| 2003/0010922 | A1 * | 1/2003 | Yoon et al. | 250/370.09 |
| 2003/0038241 | A1 * | 2/2003 | Choo et al. | 250/370.09 |
| 2003/0063706 | A1 * | 4/2003 | Ikeda et al. | 378/98.8 |
| 2004/0041097 | A1 * | 3/2004 | Ishii et al. | 250/370.07 |
| 2004/0183023 | A1 * | 9/2004 | Choo et al. | 250/370.09 |
| 2004/0183024 | A1 * | 9/2004 | Choo et al. | 250/370.09 |
| 2005/0017189 | A1 * | 1/2005 | Homma et al. | 250/370.11 |
| 2005/0082492 | A1 * | 4/2005 | Lin et al. | 250/370.14 |
| 2005/0145800 | A1 * | 7/2005 | Mochizuki | 250/370.09 |
| 2005/0263709 | A1 * | 12/2005 | Watanabe et al. | 250/370.11 |
| 2007/0272870 | A1 * | 11/2007 | Ishii et al. | 250/370.08 |
| 2009/0146147 | A1 * | 6/2009 | Kim | 257/59 |

* cited by examiner

*Primary Examiner*—David P Porta
*Assistant Examiner*—Kiho Kim
(74) *Attorney, Agent, or Firm*—McKenna Long & Aldridge LLP

(57) ABSTRACT

A digital x-ray detector and its fabrication method are disclosed to strengthen an electrical connection between an upper electrode and a lower by employing a multi-contact hole structure and obtaining reliability of a contact hole by electrically connecting the side of the lower line and the upper electrode. A semiconductor layer is inserted at a lower portion of the contact hole to prevent damage of a gate insulating layer possibly caused by an overetch to thus reduce a defective contact.

25 Claims, 15 Drawing Sheets

DIGITAL X-RAY DETECTOR AND FABRICATION METHOD THEREOF

This application claims the benefit of Korean Application No. 10-2007-0127192 filed Dec. 7, 2007, which is hereby incorporated by reference for all purposes as if fully set forth herein.

BACKGROUND OF THE INVENTION

1. Field of the Invention

The present invention relates to a digital x-ray detector and its fabrication method and, more particularly, to a digital x-ray detector and its fabrication method capable of preventing a defective contact by strengthening an electrical connection via a contact hole and obtaining reliability of the contact hole.

2. Discussion of the Related Art

Currently, a diagnosing x-ray inspecting device commonly used for medical purposes performs photographing by using an x-ray detecting film and the file is subjected to be printed for a certain time to obtain the results.

However, recently, in line with the advancement of semiconductor technology, a digital x-ray detector (DXD) using a thin film transistor (TFT) has been studied and developed. The digital x-ray detector is advantageous in that results can be diagnosed in real time immediately when x-raying is performed The structure of the general digital x-ray detector will now be described in detail with reference to the accompanying drawings.

FIG. 1 is a sectional view schematically showing an operation of the general digital x-ray detector.

As shown in FIG. 1, a digital x-ray detector 1 includes an array substrate (not shown) at a lower portion thereof, TFTs 3, storage capacitors 4, charge collecting electrodes 19, a light conductive film 2, an upper electrode 5, high voltage DC power (Ev), or the like.

The light conductive film 2 internally forms an electrical signal, namely, pairs of electrons-holes 7, in proportion to external signal strength such as incident electric waves or magnetic waves. Namely, the light conductive film 2 serves as a converter that converts an external signal, especially, x-ray, into an electrical signal.

In this case, the electron-hole pairs 7 formed by x-ray, gather in the form of electric charges at charge collecting electrodes 19 positioned below the light conductive film 2 by the voltage applied from the high voltage DC power (Ev) positioned at the upper electrode 5 on the light conductive film 2, and stored in the storage capacitor 4 formed together with a storage electrode grounded from the exterior. The charges stored in the storage capacitor 4 are sent to an external image processing element by the TFTs 3 controlled by the exterior, and produce a certain x-ray image.

In this respect, for the digital x-ray detector 1 to detect weak x-ray light and convert it into a charge, the value of the trap state density to trap charges within the light conductive film 2 should be reduced. Also, a high voltage should be applied vertically between the upper electrode 5 and the charge collecting electrodes 19 to reduce current flowing by the voltage other than in a vertical direction.

However, charges within the light conductive film 2 generated by x-ray light are also trapped to gather at an upper portion of a protection layer (not shown) protecting a channel part of the TFT 3 as well as at the charge collecting electrodes 19. The trapped and collected charges induct charges to the channel region at the upper portion of the TFT 3 to cause much leakage current even when the TFT 3 is turned off to make the TFT 3 not perform a switching operation.

In addition, because the electrical signal stored in the storage capacitor 4 flows outside of the storage capacitor 4 due to leakage current in the OFF state, a desired image cannot be properly expressed.

FIG. 2 is a plan view schematically showing a portion of the array substrate of the general digital x-ray detector.

As shown In FIG. 2, the array substrate 10 of the digital x-ray detector includes a gate line 16 and a data line 17 arranged horizontally and vertically to define a pixel area, a TFT, a switching element, formed at the crossing of the gate line 16 and the data line 17, and a ground line 8 are arranged in one direction and commonly grounded with an adjacent pixel.

A storage electrode 9 and a second pixel electrode 18' forming a storage capacitor as a charge storage unit are formed at the pixel area, and a second insulating layer (not shown) formed of a silicon nitride film as a dielectric material is inserted between the storage electrode 9 and the second pixel electrode 18'.

The charge collecting electrode 19 is formed to extend up to an upper portion of the TFT, electrically connected with the second pixel electrode 18' via a third contact hole 40c to accumulate holes generated from the light conductive film (not shown) in the storage capacitor, and electrically connected with a drain electrode 23 via a first contact hole 40a, a second contact hole 40b and the first pixel electrode 18 to allow the holes stored in the storage capacitor to be combined with electrons introduced via the TFT.

In this case, the TFT includes a gate electrode 21 connected with the gate line 16, a source electrode 22 connected with the data line 17, and the drain electrode 23 connected with the first pixel electrode 18. In addition, the TFT includes a first insulating layer (not shown) to insulate the gate electrode 21 and the source and drain electrodes 22 and 23, and an active pattern (not shown) formed of an amorphous silicon thin film.

A gate pad electrode 26p and a data pad electrode 27p are formed at edges of the array substrate 10 and electrically connected with the gate line 16 and the data line 17, respectively. The gate pad electrode 26p and the data pad electrode 27p are connected with an outer lead out IC (Integrated Circuit) according to a tape carrier package (TCP) method.

Namely, the data line 17 and the gate line 16 extend in one direction, respectively, so as to be connected with the first and second data pad lines 17p and 17p' and the gate pad line 16p, and the first and second data pad lines 17p and 17p' and the gate pad line 16p are electrically connected with the data pad electrode 27p and the gate pad electrode 26p via a fourth contact hole 40d and a fifth contact hole 40e formed at a third insulating layer (not shown).

The process of fabricating the digital x-ray detector basically requires a plurality of masking processes (namely, photolithography processes) to fabricate the array substrate including TFTs, so a method for reducing the number of masks is required in terms of productivity.

FIGS. 3A to 3H are sectional views sequentially showing the fabrication process of the array substrate taken along lines IIa-IIa', IIb-IIb and IIc-IIc in the digital x-ray detector as shown in FIG. 2.

As shown in FIG. 3A, a first conductive film is formed on the array substrate 10 and patterned by using a photolithography process (a first masking process) to form the gate electrode 21 and the gate line (not shown) at the pixel area of the array substrate 10 and the gate pad line 16p at a gate pad part of the array substrate 10.

Next, as shown in FIG. 3B, a first insulating layer 15a, an amorphous silicon thin film and an n+ amorphous silicon thin film are sequentially deposited on the entire surface of the array substrate with the gate electrode 21, the gate line and the gate pad line 16p formed thereon, and then, the amorphous silicon thin film and the n+ amorphous silicon thin film are selectively patterned by using a photolithography process (a second masking process) to form an active pattern 24 formed of the amorphous silicon thin film at an upper portion of the gate electrode 21.

An n+ amorphous silicon thin film 25, which has been patterned in the same shape as the active pattern 24, is formed on the active pattern 24.

As shown in FIG. 3C, a second conductive film is formed on the entire surface of the array substrate 10 and then selectively patterned by using a photolithography process (a third masking process) to form the source electrode 22 and the drain electrode 23 on the active pattern 24.

Through the third masking process, the data line 17 formed of the second conductive film is formed at the data line region of the array substrate 10 and the first data pad line 17p formed of the second conductive film is formed at the data pad part of the array substrate 10.

Also, through the third masking process, the ground line 8 formed of the second conductive film is formed in the pixel area of the array substrate 10 such that it is arranged in a direction substantially parallel to the data line 17 and commonly grounded with an adjacent pixel.

A portion of the n+ amorphous silicon thin film formed on the active pattern 24 is removed through the third masking process to form an ohmic-contact layer 25n that allows the source/drain regions of the active pattern 24, the source electrode 22, and the drain electrode 23 to be in ohmic-contact.

Thereafter, as shown in FIG. 3D, the storage electrode 9 connected with the ground line 8 is formed at the pixel area of the array substrate 10 through a fourth masking process.

With reference to FIG. 3E, a second insulating layer 15b formed of a silicon nitride film is formed on the entire surface of the array substrate 10 with the storage electrode 9 formed thereon and selectively patterned by using a photolithography process (a fifth masking process) to form a first contact hole 40a exposing a portion of the drain electrode 23 and a pad part hall (H) exposing a portion of the first data pad line 17p.

As shown in FIG. 3F, a third conductive film is formed on the entire surface of the array substrate 10 with the second insulating layer 15b formed thereon and selectively patterned by using a photolithography process (sixth masking process) to form the first pixel electrode 18 electrically connected with the drain electrode 23 via the first contact hole 40a and the second data pad line 17p' electrically connected with the first data pad line 17p via the pad part hole (H).

At this time, the second pixel electrode 18' formed of the third conductive film is formed above the storage electrode 9, and overlaps with a portion of the storage electrode 9 with the second insulating layer 15b interposed therebetween to form a storage capacitor.

With reference to FIG. 3G, a third insulating layer 15c is formed on the entire surface of the array substrate 10 and partially removed through a seventh masking process to form the second contact hole 40b and a third contact hole 40c exposing portions of the first and second pixel electrodes 18 and 18', respectively. In this case, the third insulating layer 15c is formed of an organic insulating layer to reduce parasitic capacitance.

A portion of the third insulating layer 15c is removed by using the seventh masking process to form fourth and fifth contact holes 40d and 40e, exposing portions of the second data pad line 17p' and the gate pad line 16p, respectively, at the data pad part and the gate pad part.

As shown in FIG. 3H, a fourth conductive film is formed on the entire surface of the array substrate 10 and selectively patterned through a photolithography process (an eighth masking process) to form the charge collecting electrode 19 electrically connected with the first and second pixel electrodes 18 and 18' via the second and third contact holes 40b and 40c.

Through the eighth masking process, the data pad electrode 27p and the gate pad electrode 26p are formed to be electrically connected with the second data pad line 17p' and the gate pad line 16p via the fourth and fifth contact holes 40d and 40e.

Although not shown, a process of coating a photosensitive material is performed. The photosensitive material is used as a converter that receives an external signal and converts it into an electrical signal and made of a compound of amorphous selenium.

After the photosensitive material is coated, a transparent upper electrode is formed to allow x-ray light to transmit therethrough.

As described above, the fabrication of the array substrate of the digital x-ray detector including the TFTs requires a total of eight photolithography processes to pattern the gate electrode, the active pattern, the source/drain electrodes, the storage electrodes, the first contact hole, the pixel electrode, the second to fifth contact holes, the charge collecting electrodes, and the like.

In addition, because the array substrate of the general digital x-ray detector includes three insulating layers and three transparent electrode layers, the transparent electrode patterning process is performed three times to form the storage capacitors, causing problems in that the working process is complicated and the gate electrode and the source/drain electrodes are worn out by a transparent electrode etching solution.

Here, the photolithography process transfers a pattern formed on a mask onto the substrate with a thin film deposited thereon to form a desired pattern, which includes a plurality of processes such as a process of coating a photosensitive solution, an exposing process and a developing process, etc, so the plurality of photolithography processes degrade a production yield.

In particular, the masks designed for the pattern is high-priced, so the increase in the number of masks applied to the processes increases the fabrication costs of the digital x-ray detector proportionally.

In addition, the tape automated bonding (TAB) technique is applied to attach the IC for the lead out, for which contact holes are required to electrically connect the lower pad line and the upper electrode.

Also, when the pad lines such as the gate pad line, the data pad line and the storage pad line are formed on the array substrate of the general digital x-ray detector, if metal such as molybdenum which is easily etched by dry etching is applied, the pad lines may be overetched or may not be properly etched due to the dry etching.

Moreover, in case of the general digital x-ray detector, the thickness of the third insulating layer is formed to be relatively thick in order to reduce parasitic capacitance, while the second insulating layer is formed to be relatively thin in order to increase the storage capacitance, resulting in that the thicknesses of the insulating layers at the drain region, the storage region, the storage pad part, the gate pad part and the data pad part where contacts exist are different. The difference in the thicknesses of the insulating layers causes the drain electrode, the ground line and the pad line to be overetched or not to be properly etched in the etching process for forming the contact holes, degrading the reliability of the contact holes.

SUMMARY OF THE INVENTION

Accordingly, the present invention is directed to a digital x-ray detector and fabrication thereof that substantially obviates one or more of the problems due to limitations and disadvantages of the prior art.

An advantage of the present invention is to provide a method for fabricating a digital x-ray detector capable of fabricating an array substrate of the digital x-ray detector through a total seven times of masking processes.

Another advantage of the present invention is to provide a digital x-ray detector in which an electrical connection between an upper electrode and a lower line is strengthened through a multi-contact hole structure, and its fabrication method.

Still another advantage of the present invention is to provide a digital x-ray detector capable of preventing generation of a defective contact by accomplishing the reliability of contact holes, and its fabrication method.

To achieve these and other advantages and in accordance with the purpose of the present invention, as embodied and broadly described, a digital x-ray detector including: a substrate having a pixel part, a data pad part and a gate pad part; a gate electrode and a gate line formed at the pixel part of the substrate; a first insulating layer formed on the substrate; first to fourth semiconductor layers formed at an upper portion of the gate electrode, a drain electrode area, a pixel area, and the data pad part, respectively; a source electrode formed at the pixel part of the substrate, a drain electrode having a portion positioned on the second semiconductor layer, and a data line crossing the gate line to define the pixel area; a ground line arranged in one direction at the pixel area of the substrate, commonly grounded with an adjacent pixel and having a portion positioned on the third semiconductor layer; a second insulating layer formed on the substrate; a first contact hole formed by selectively removing the second insulating layer and a portion of the drain electrode and exposing a portion of the first semiconductor layer; a plurality of second contact holes formed by selectively removing portions of the ground line and the second insulating layer and exposing a portion of the second semiconductor layer; a first connection electrode electrically connected with the side of the drain electrode via the first contact hole and a storage electrode electrically connected with the side of the ground line via the plurality of second contact holes; a third insulating layer formed on the substrate; a fifth contact hole formed by selectively removing a portion of the third insulating layer and exposing a portion of the first connection electrode; a charge collecting electrode electrically connected with the first connection electrode via the fifth contact hole and having a portion overlapping with the storage electrode to form a storage capacitor; a light conductive film formed on the substrate; and an upper electrode formed on the light conductive film.

In another aspect of the present invention, a method for fabricating a digital x-ray detector, including: providing a substrate having a pixel part, a data pad part and a gate pad part; forming a gate electrode and a gate line at the pixel part of the substrate; forming a first insulating layer on the substrate; forming a first semiconductor layer at an upper portion of the gate electrode; and forming second to fourth semiconductor layers at a drain electrode area, a pixel area and a data pad part, respectively; forming a source electrode, a drain electrode and a data line crossing the gate line to define the pixel area at the pixel part of the substrate such that a portion of the drain electrode is positioned on the second semiconductor layer; forming a ground line such that the ground line is arranged in one direction at the pixel area of the substrate so as to be commonly grounded with an adjacent pixel and a portion of the ground line is positioned on the third semiconductor layer; forming a second insulating layer on the substrate; selectively removing portions of the drain electrode and the second insulating layer to form a first contact hole exposing a portion of the first semiconductor layer and selectively removing portions of the ground line and the second insulating layer to expose a plurality of second contact holes; forming a first connection electrode electrically connected with the side of the drain electrode via the first contact hole and forming a storage electrode electrically connected with the side of the ground line via the plurality of second contact holes; forming a third insulating layer on the substrate; selectively removing a portion of the third insulating layer to form a fifth contact hole exposing a portion of the first connection electrode; forming a charge collecting electrode electrically connected with the first connection electrode via the fifth contact hole and having a portion overlapping with the storage electrode to form a storage capacitor; forming a light conductive film on the substrate; and forming an upper electrode on the light conductive film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE INVENTION

A digital x-ray detector and its fabrication according to exemplary embodiments of the present invention will now be described in detail with reference to the accompanying drawings.

Figure 1:
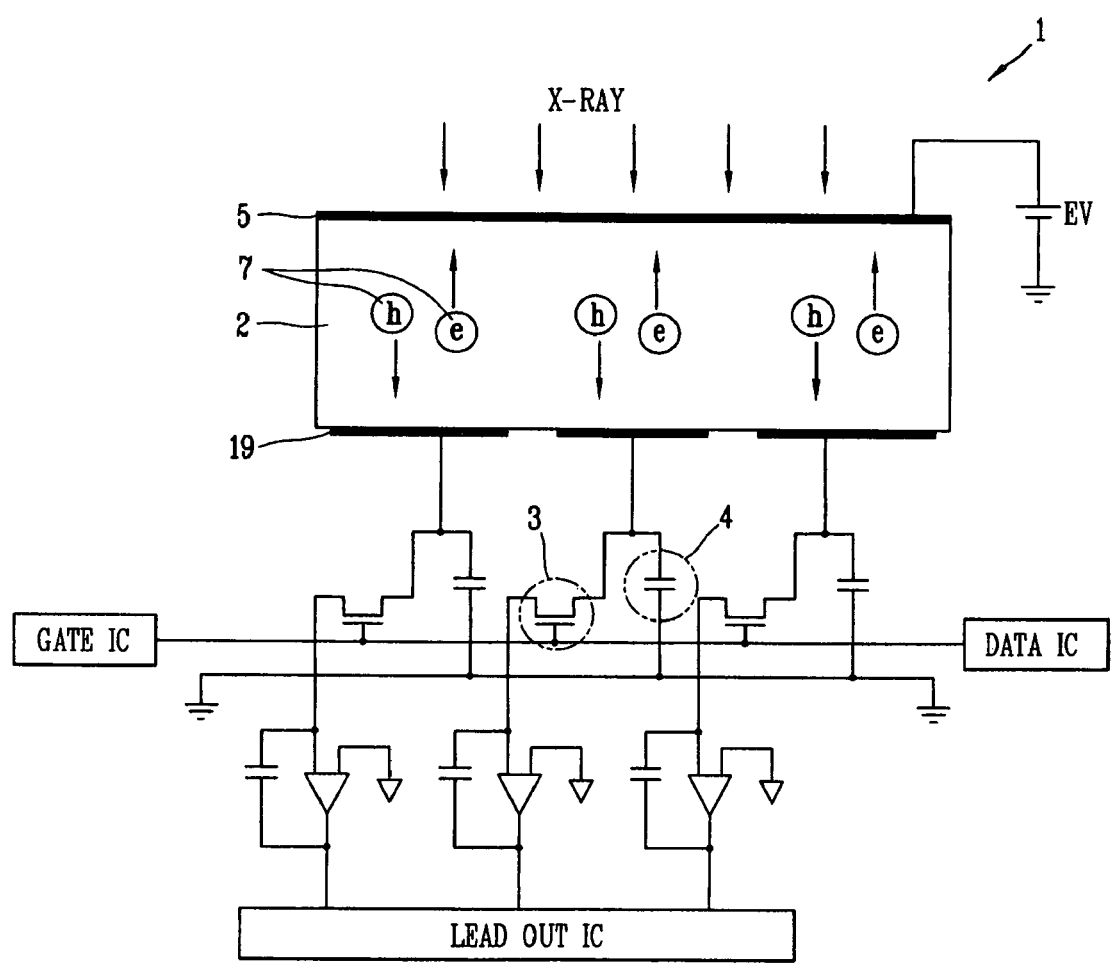
FIG. 1 is a sectional view schematically showing an operation of a general digital x-ray detector.
Figure 2:
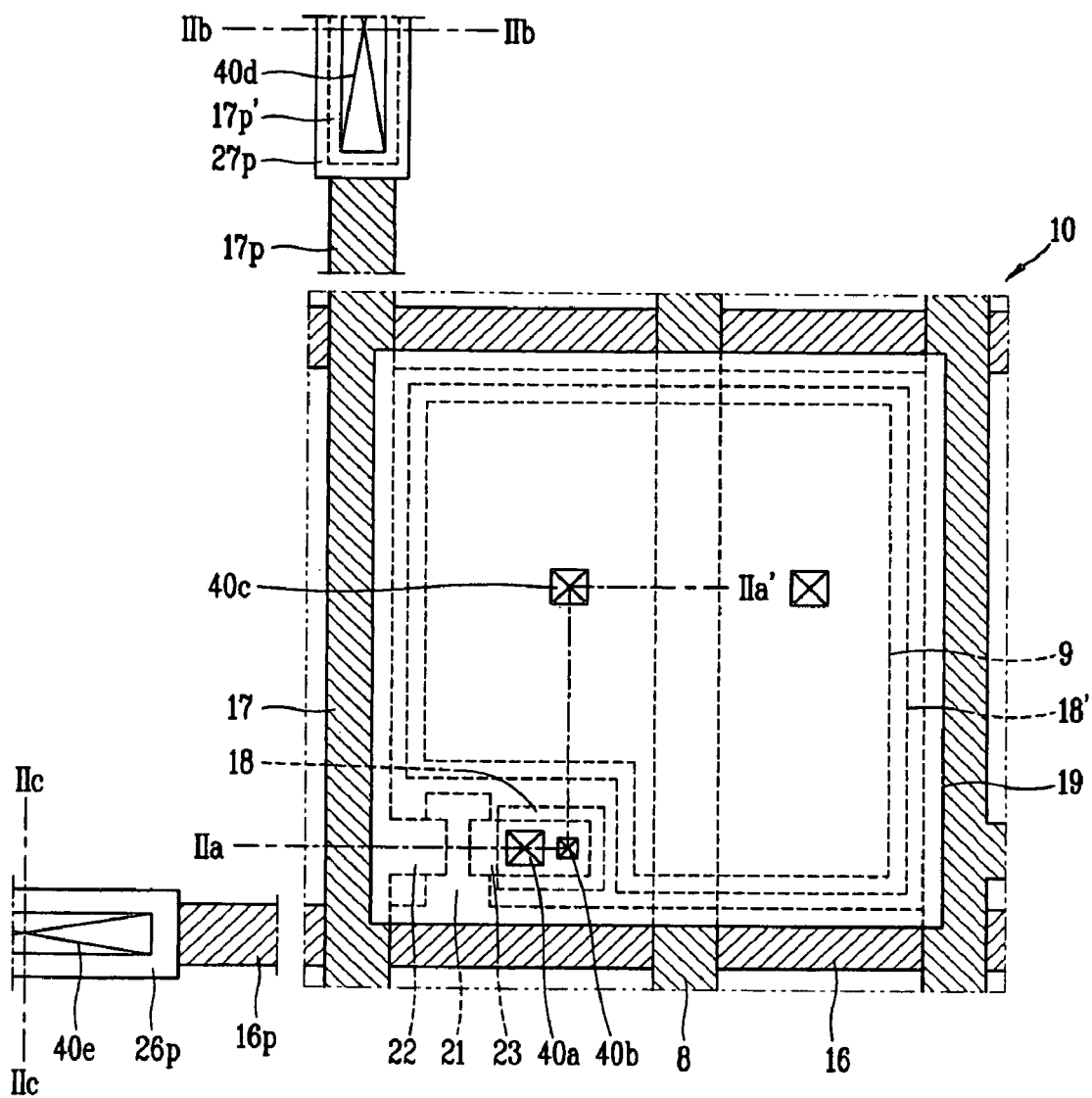
FIG. 2 is a plan view schematically showing a portion of an array substrate of the general digital x-ray detector.
Figure 3A:
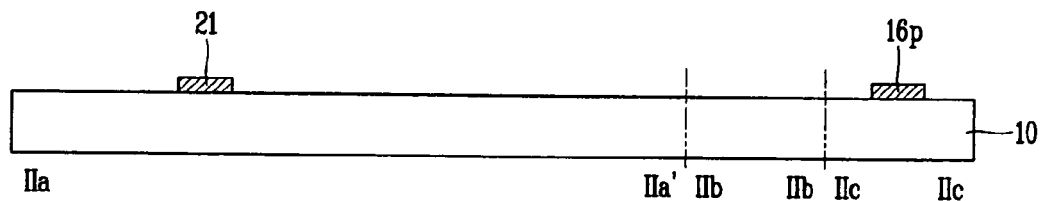
FIGS. 3A to 3H are sectional views sequentially showing the process of fabricating the array substrate taken along lines IIa-IIa', IIb-IIb and IIc-IIc of the digital x-ray detector in FIG. 2.
Figure 3B:
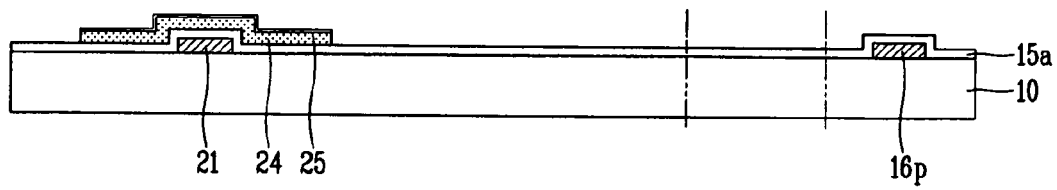
Figure 3C:
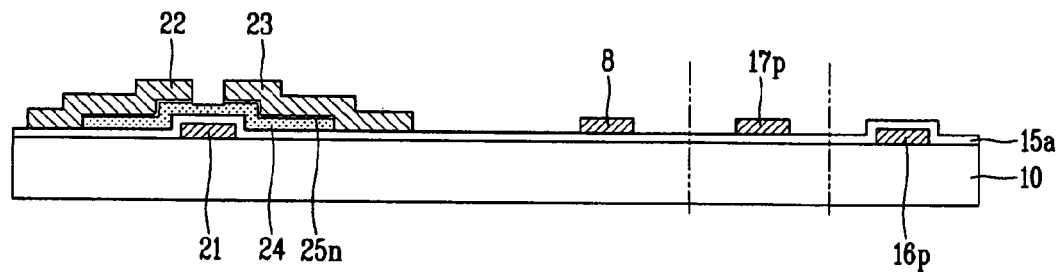
Figure 3D:
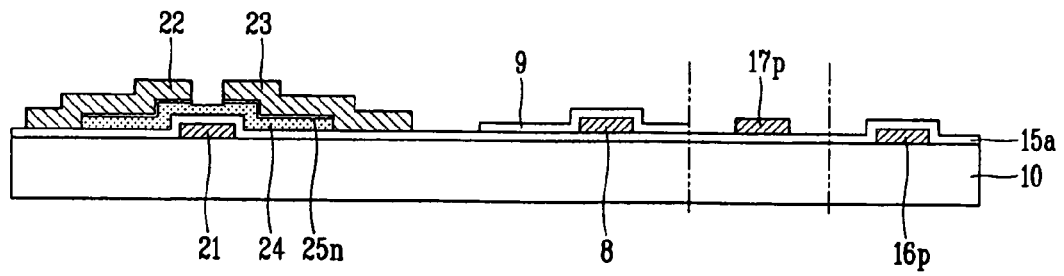
Figure 3E:
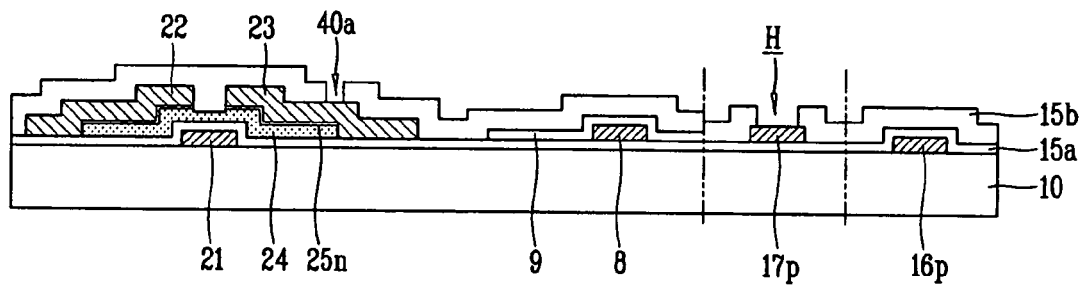
Figure 3F:
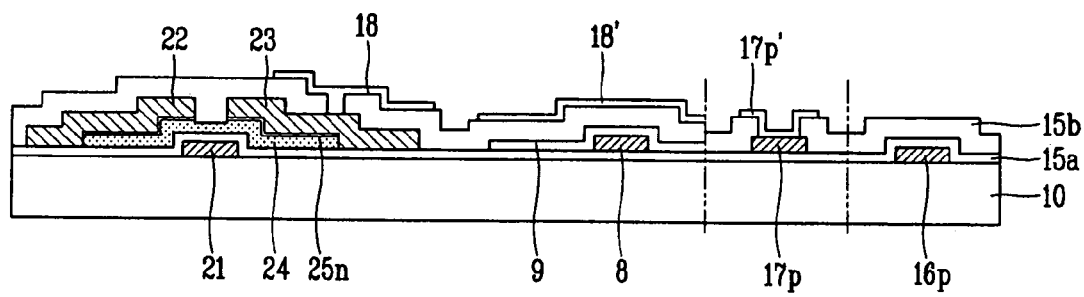
Figure 3G:
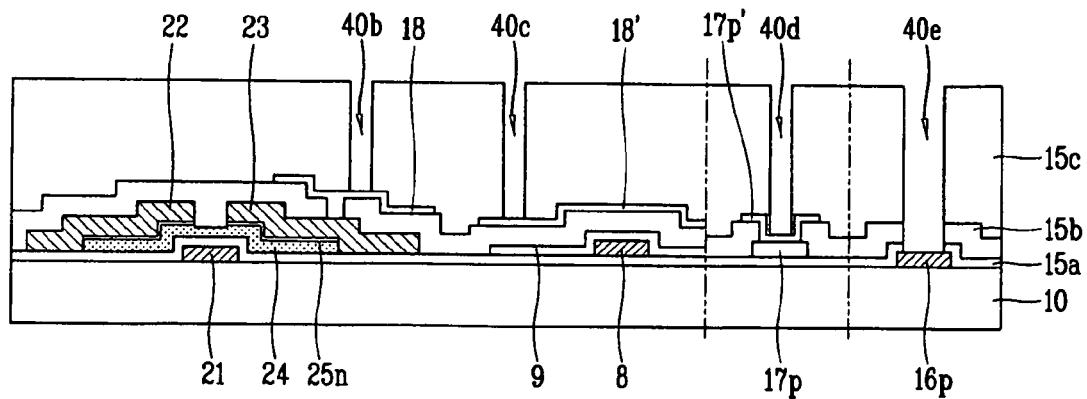
Figure 3H:
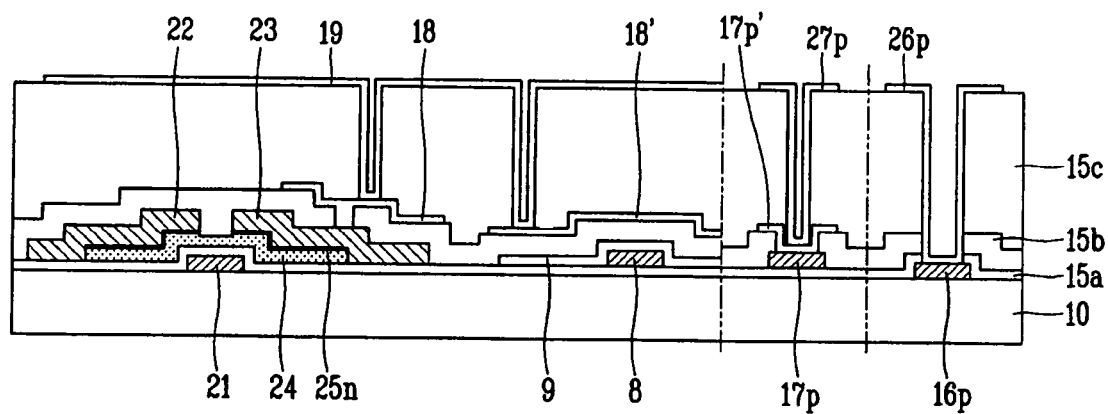
Figure 4:
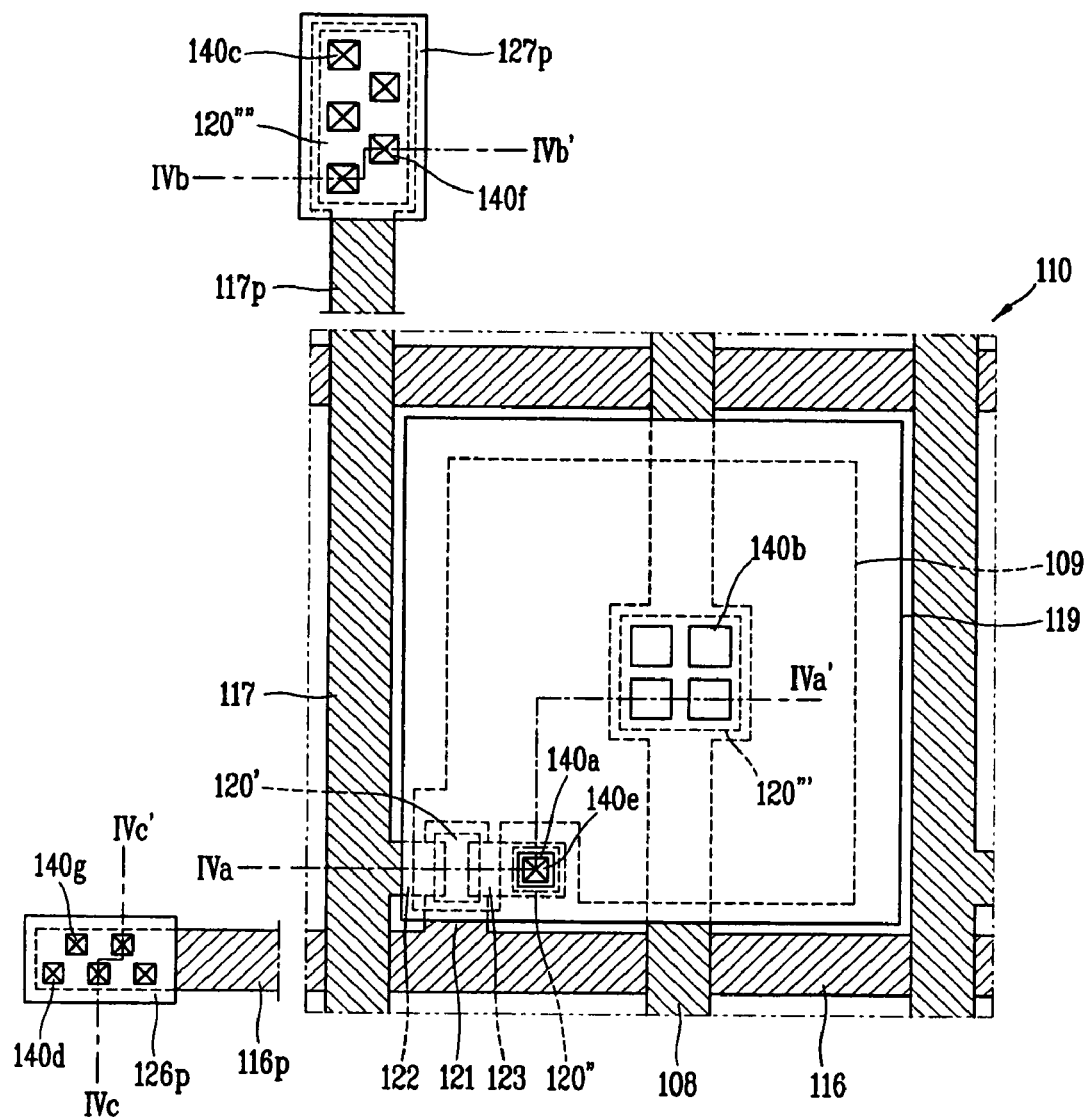
FIG. 4 is a plan view schematically showing a portion of an array substrate of a digital x-ray detector according to an embodiment of the present invention.

FIG. 4 is a plan view schematically showing a portion of an array substrate of a digital x-ray detector according to an embodiment of the present invention, which includes single pixel including a thin film transistor (TFT) of a pixel part, a data pad part and a gate pad part.

A storage pad part is not shown in the drawing, however, the structure of the storage pad part is substantially the same as that of the data pad part.

In the digital x-ray detector, the N number of gate lines and the M number of data lines are formed to cross each other to define the M×N number of pixels. For illustrative purposes only, one pixel is shown on the drawing.

As illustrated, an array substrate 110 includes a gate line 116 and a data line 117 formed to be arranged vertically and horizontally to define a pixel area, a thin film transistor (TFT), a switching element, formed at a crossing of the gate line 116 and the data line 117, and a ground line 108 arranged in one direction and commonly grounded with an adjacent pixel. In this case, the ground line 108 serves to remove a residual charge remaining within a storage capacitor.

The TFT includes a gate electrode 121 connected with the gate line 116, a source electrode 122 connected with the data line 117, and a drain electrode 123 electrically connected with a charge collecting electrode 119. The TFT further includes a first insulating layer (not shown) for insulating the gate electrode 121, the source electrode 122, the drain electrode 123 and a first semiconductor layer 120' formed of an amorphous silicon thin film and an n+ amorphous silicon thin film.

A storage electrode 109 forming a storage capacitor together with the charge collecting electrode 119 as a charge storage unit is formed at the pixel area, and a third insulating layer (not shown) formed of a silicon nitride film with a dielectric material is formed between the charge collecting electrode 119 and the storage electrode 109.

Here, in the embodiment of the present invention, the charge collecting electrode 119 extends up to an upper portion of the TFT and forms the storage capacitor together with the storage electrode 109 to allow holes generated from a light conductive film (not shown) to be accumulated within the storage capacitor, and electrically connected with the drain electrode 123 via a first contact hole 140a, a fifth contact hole 140e and a first connection electrode (not shown) to allow the holes stored in the storage capacitor to be combined with electrons introduced via the TFT. A second semiconductor layer 120" formed of the amorphous silicon thin film and the n+ amorphous silicon thin film is formed at the lower portions of the first contact hole 140a and the drain electrode 123.

Namely, the data line 117 and the gate line 116 extend in one direction, respectively, so as to be connected with the data pad line 117p and the gate pad line 116p. The data pad line 117p is electrically connected with the data pad electrode 127p via a third contact hole 140c, a sixth contact hole 140f and a second connection electrode (not shown). The gate pad line 116p is electrically connected with the gate pad electrode 126p via a fourth contact hole 140d, a seventh contact hole 140g, and a third connection electrode (not shown).

In detail, the data pad line 117p is electrically connected with the second connection electrode via the plurality of third contact holes 140c formed at the second insulating layer, and the second connection electrode is electrically connected with the side of the data pad electrode 127p via the plurality of sixth contact holes 140f formed at the third insulating layer. The gate pad line 116p is electrically connected with the third connection electrode via the plurality of fourth contact holes 140d formed at the second insulating layer, and the third connection electrode is electrically connected with the side of the gate pad electrode 126p via the plurality of seventh contact holes 140g.

Fourth semiconductor layers 120"" formed of the amorphous silicon thin film and the n+ amorphous silicon thin film are formed below the third contact hole 140c, the sixth contact hole 140f and the data pad line 117p.

In this manner, in the digital x-ray detector according to the present invention, the drain electrode, the ground line and the data pad line are electrically connected with the sides of the first connection electrode, the storage electrode and the second connection electrode via the first to third contact holes, and the second to fourth semiconductor layers formed of the amorphous silicon thin film and the n+ amorphous silicon thin film are formed below the first contact hole and the first connection electrode, the second contact hole and the storage electrode, and the third contact hole and the second connection electrode. In this case, the second to fourth semiconductor layers are overetched in the process of forming the first to third contact holes to thus prevent the lower gate insulating layer, namely, the first insulating layer, from being damaged.

In addition, the digital x-ray detector according to the embodiment of the present invention employs the multi-contact hole structure to strengthen the electrical connection between the upper electrodes (i.e., the storage electrode, the data pad electrode and the gate pad electrode) and the lower lines (e.g., the ground line, the data pad line and the gate pad line), to thus obtain reliability of the contact holes and prevent a defect caused by a contact misalignment.

In the digital x-ray detector, when electron-hole pairs are created as an x-ray received from an upper portion of a second substrate (not shown) meets amorphous selenium ions, the charges are charged in the storage capacitor via the charge collecting electrode, and then, when the TFTs are turned on, the charged charges are transferred to an external lead out circuit via the TFTs.

For example, if a part of the human body is x-rayed, the part through which x-ray transmits has a large amount of charges charged in the charge collecting electrode, while a part through which x-ray transmits is low has a small amount of charges charged in the charge collecting electrode. Such difference can be displayed through an image.

The digital x-ray detector according to the embodiment of the present invention includes a protection layer structure formed with a single layer in which the protection layer structure includes two layers, and because a portion of the charge collecting electrode is used to form the storage capacitor together with the storage electrode, the array substrate can be fabricated through a total of seven masking processes. This will now be described in detail through a method for fabricating the digital x-ray detector as follows.

FIGS. 5A to 5G are sectional views sequentially showing a fabrication process taken along lines IVa-IVa', IVb-IVb' and IVc-IVc' of the array substrate in FIG. 4, in which the left side shows the process of fabricating the array substrate of the pixel part and the right side shows the process of fabricating the array substrate of the data pad part and the gate pad part. Although the process of fabricating the array substrate of the storage pad part is not shown, it would be substantially the same as the process of fabricating the array substrate of the data pad part.

FIGS. 6A to 6G are plan views sequentially showing the fabrication process of the array substrate in FIG. 4.

Figure 5A:
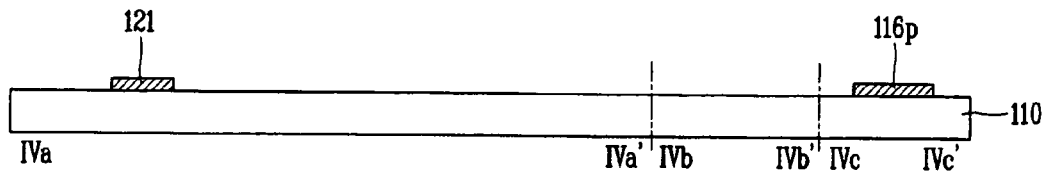
FIGS. 5A to 5G are sectional views sequentially showing a fabrication process taken along lines IVa-IVa', IVb-IVb' and IVc-IVc' of the array substrate in FIG. 4.
Figure 6A:
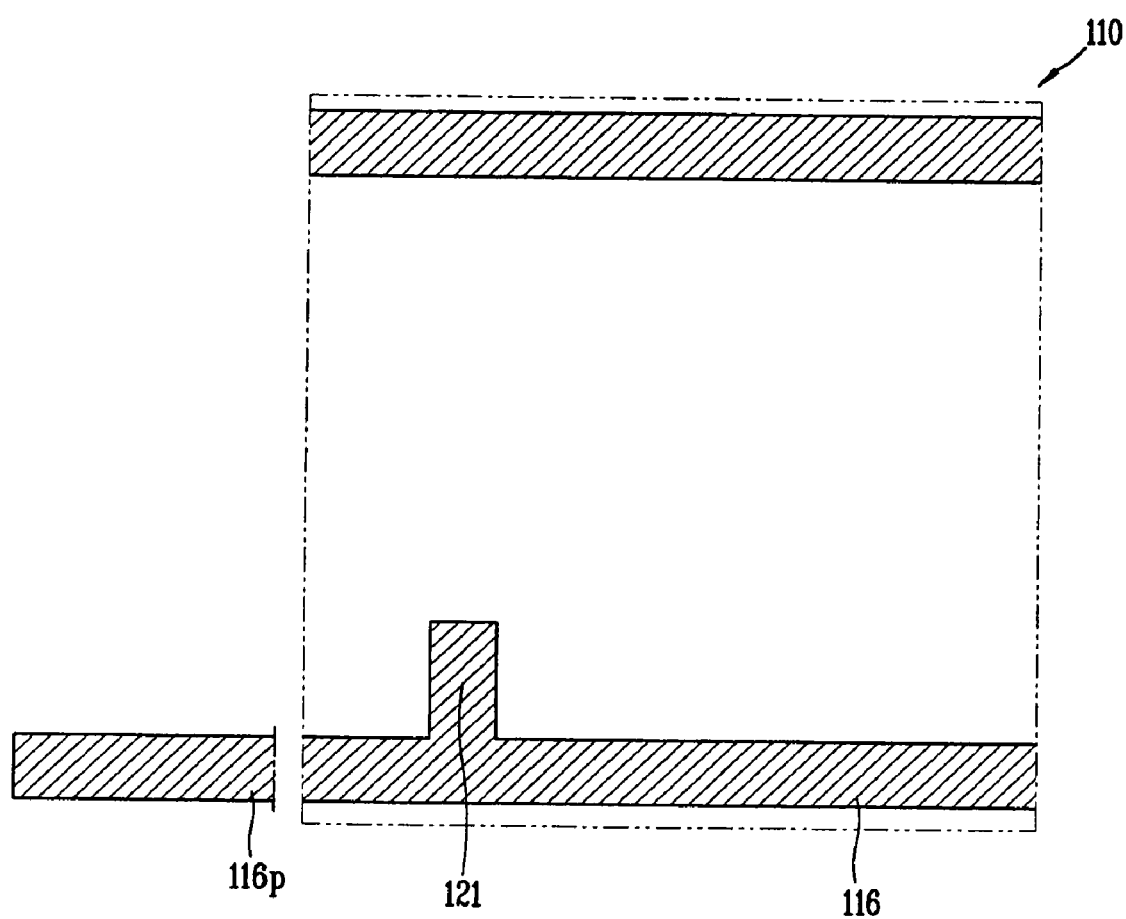
FIGS. 6A to 6G are plan views sequentially showing a fabrication process of the array substrate in FIG. 4.

As shown in FIGS. 5A and 6A, the gate electrode 121 and the gate line 116 are formed at the pixel part of the array substrate 110 made of a transparent insulating material such as glass, and the gate pad line 116p is formed at the gate pad part 110.""

The gate electrode 121, the gate line 116 and the gate pad line 116p are formed by depositing a first conductive film on the entire surface of the array substrate 110 and selectively patterning them through a photolithography process (a first masking process).

Here, the first conductive film may be made of a low-resistance opaque conductive material such as aluminum (Al), an aluminum alloy, tungsten (W), copper (Cu), chromium (Cr), molybdenum (Mo), or the like. Also, the first conductive film may be formed to have a multi-layered structure by stacking two or more low-resistance conductive materials.

Figure 5B:
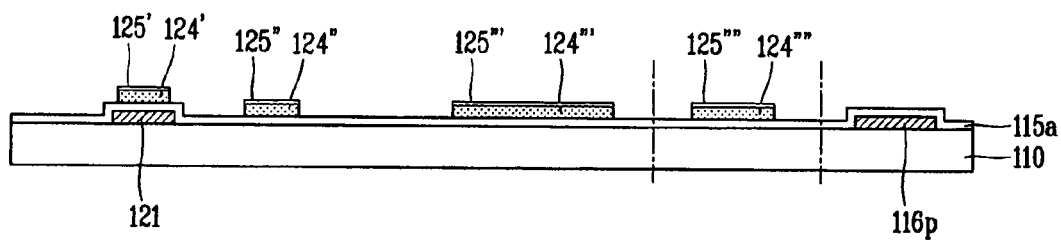
Figure 6B:
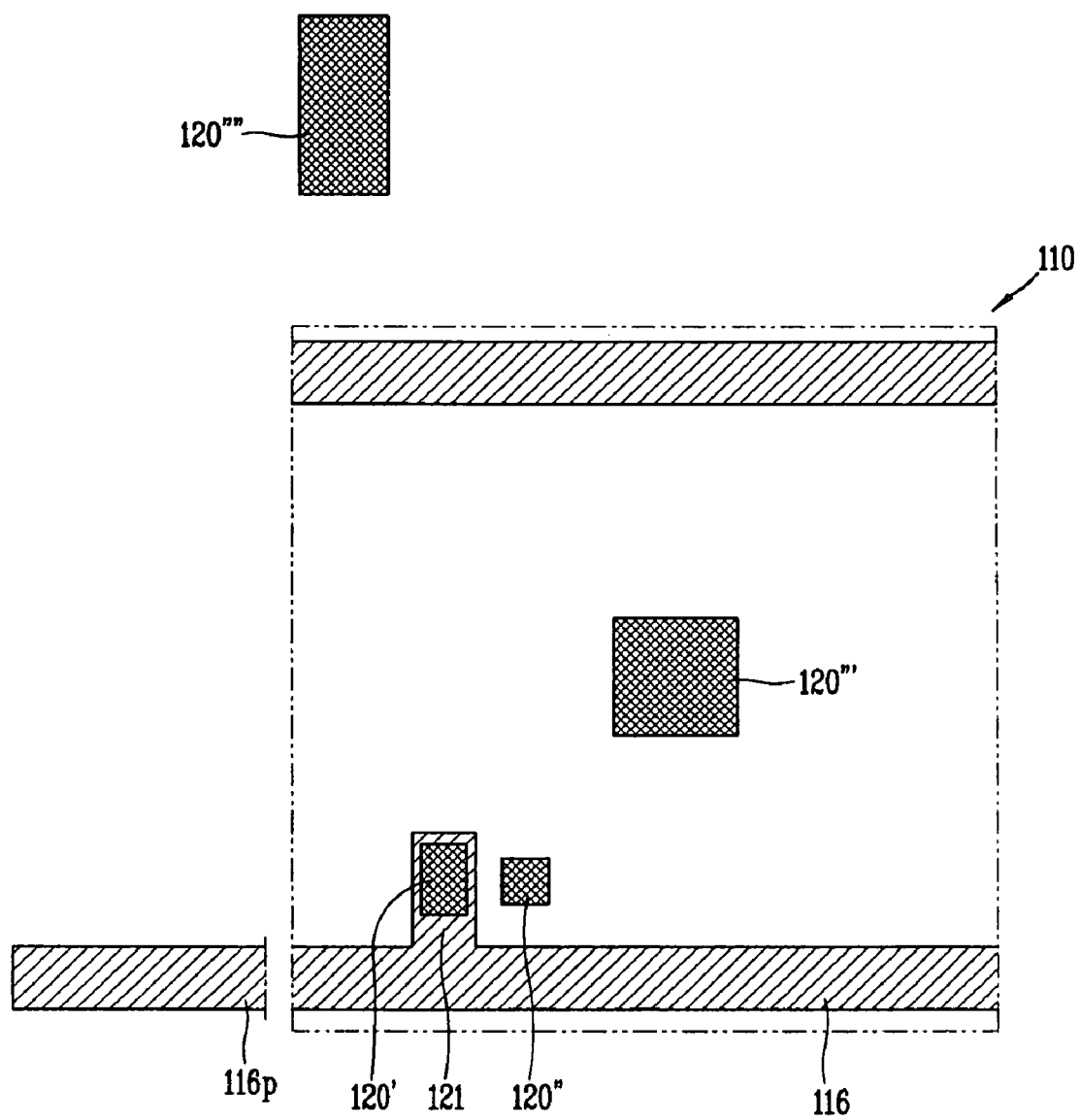

Next, as shown in FIGS. 5B and 6B, a first insulating layer 115a, an amorphous silicon thin film and an n+ amorphous silicon thin film are formed on the entire surface of the array substrate 110 with the gate electrode 121, the gate line 116 and the gate pad line 116p formed thereon, and selectively removed through a photolithography process (a second masking process) to form first to third amorphous silicon thin film patterns 124', 124" and 124'" formed of the amorphous silicon thin film at the pixel part of the array substrate 110.

In addition, fourth amorphous silicon thin film 124"" formed of the amorphous silicon thin film is formed at the data pad part of the array substrate 110 by using the second masking process.

In this case, a first n+ amorphous silicon thin film pattern 125', a second n+ amorphous silicon thin film pattern 125", a third n+ amorphous silicon thin film pattern 125'" and a fourth n+ amorphous silicon thin film pattern 125"", which are formed of the n+ amorphous silicon thin film and patterned in the same shape as the first to fourth amorphous silicon thin film patterns 124' to 124"", are formed on the first to fourth amorphous silicon thin film patterns 124' to 124"".

For illustrative purposes, the first amorphous silicon thin film pattern 124' and the first n+ amorphous silicon thin film pattern 125' will be indicated as a first semiconductor layer 120', while the second amorphous silicon thin film pattern 124" and the second n+ amorphous silicon thin film pattern 125" will be indicated as a second semiconductor layer 120". Also, the third amorphous silicon thin film pattern 124'" and the third n+ amorphous silicon thin film pattern 125'" will be indicated as a third semiconductor layer 120'" and the fourth amorphous silicon thin film pattern 124"" and the fourth n+ amorphous silicon thin film pattern 125"" will be indicated as a fourth semiconductor layer 120"". The first semiconductor layer 120' is positioned at an upper portion of the gate electrode 121, namely, at the active pattern region, and the second to fourth semiconductor layers 120" to 120"" are positioned at the drain electrode region, a central region of the storage electrode and the data pad line region, respectively.

Figure 5C:
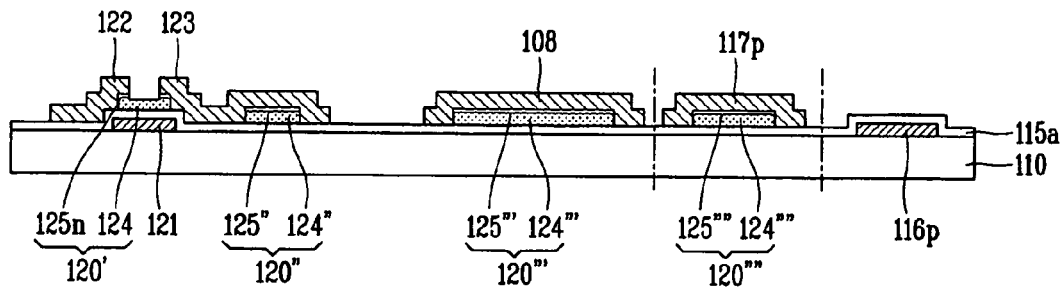
Figure 6C:
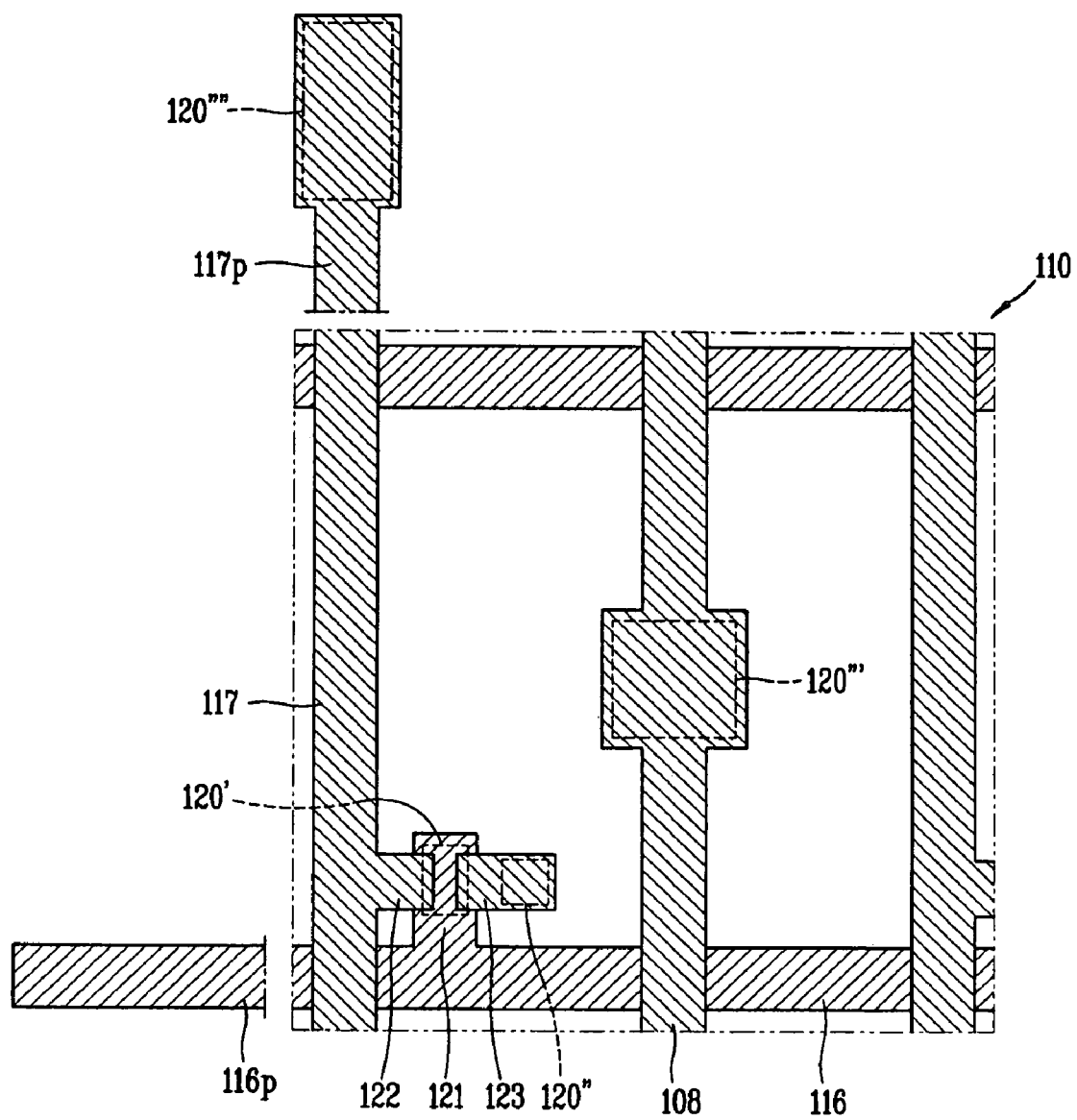

With reference to FIGS. 5C and 6C, a second conductive film is formed on the entire surface of the array substrate 110, and then selectively removed through a photolithography process (a third masking process) to form the source electrode 122 and the drain electrode 123 formed of the second conductive film on the gate electrode 121.

Also, by selectively removing the second conductive film through the third masking process, the data line 117 formed of the second conductive film is formed at the data line region of the array substrate 110 and the data pad line 117p formed of the second conductive film is formed at the data pad part of the array substrate 110.

The first amorphous silicon thin film pattern 124' is patterned to an active pattern 124 through the third masking process, and a portion of the first n+ amorphous silicon thin film pattern formed on the active pattern 124 is removed through the third masking process to form an ohmic-contact layer 125n allowing the source and drain regions of the active pattern 124 and the source and drain electrodes 122 and 123 to ohmic-contact with each other.

The active pattern 124 and the ohmic-contact layer 125n are illustrated, for example, as the first semiconductor layer 120'.

The ground line 108 according to the embodiment of the present invention formed of the second conductive film is formed to be substantially parallel to the data line 117 on the third semiconductor layer 120'" through the third masking process. The ground line 108 is commonly grounded with an adjacent pixel to serve to remove a residual charge remaining within the storage capacitor.

The second conductive film may be made of a low-resistance opaque conductive material such as aluminum (Al), an aluminum alloy, tungsten (W), copper (Cu), chromium (Cr), molybdenum (Mo), or the like, to form the source/drain electrodes 122 and 123, the data line 117, the ground line 108 and the data pad line 117p.

Figure 5D:
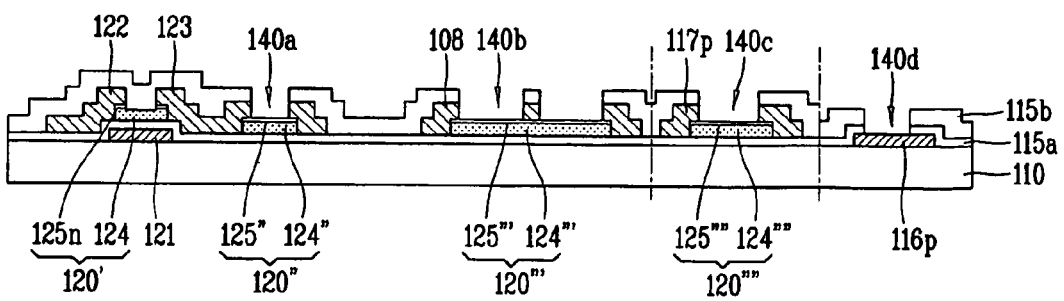
Figure 6D:
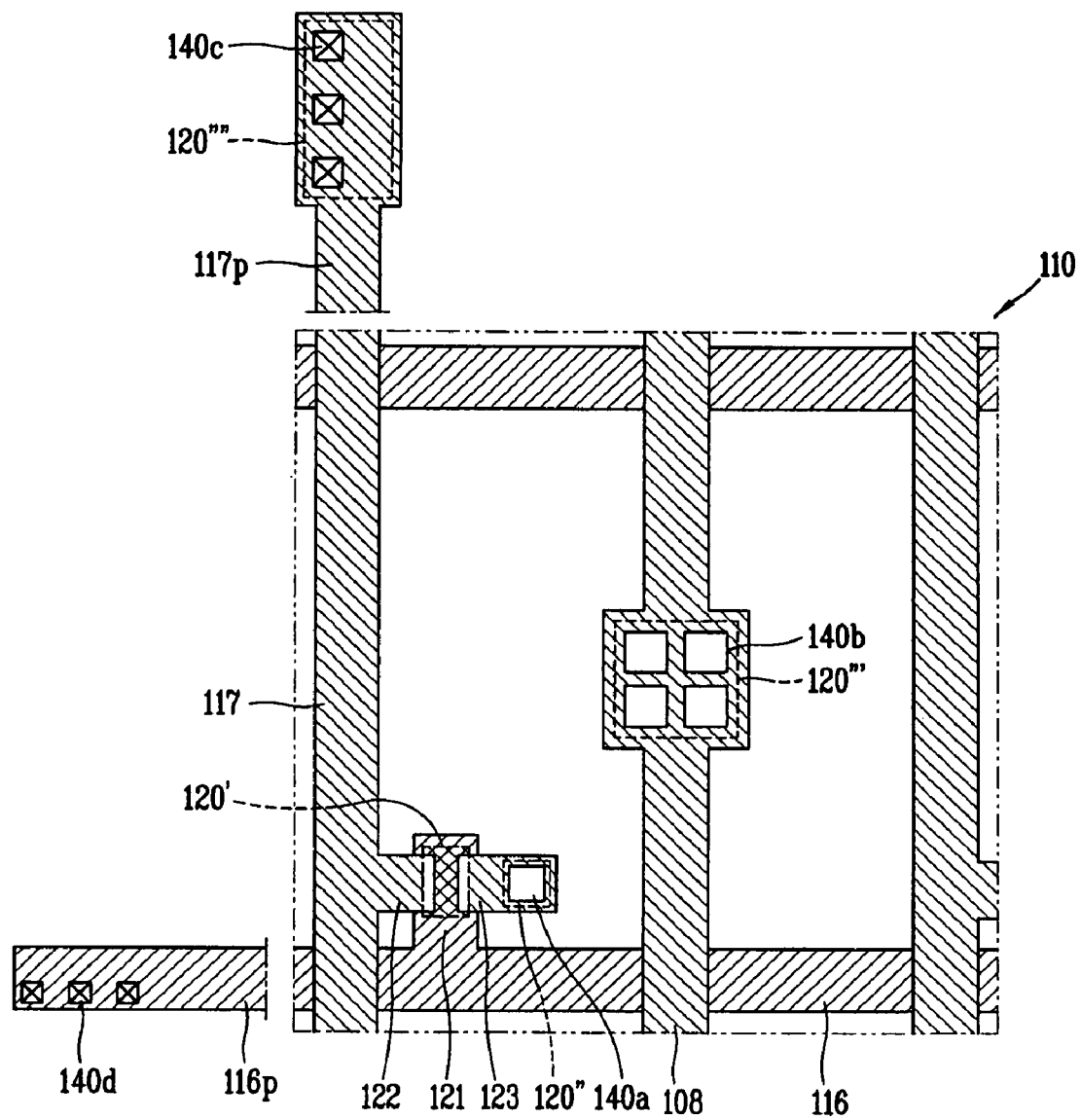

With reference to FIGS. 5D and 6D, a second insulating layer 115b is formed on the entire surface of the array substrate 110 with the source/drain electrodes 122 and 123, the data line 117, the ground line 108 and the data pad line 117p formed thereon, and then, portions of the second insulating layer 115b and the drain electrode 123 are selectively removed through a photolithography process (a fourth masking process) to form the first contact hole 140a exposing a portion of the second semiconductor layer 120".

Also, portions of the second insulating layer 115b and the ground line 108 are selectively removed through the fourth masking process to form a plurality of second contact holes 140b exposing portions of the third semiconductor layer 120'".

In addition, through the fourth masking process, portions of the second insulating layer 115b and the data pad line 117p are selectively removed to form a plurality of contact holes 140c exposing portions of the fourth semiconductor layer 120"", and portions of the first and second insulating layers 115a and 115b are selectively removed to form a plurality of fourth contact holes 140d exposing a portion of the gate pad line 116p.

Figure 5E:
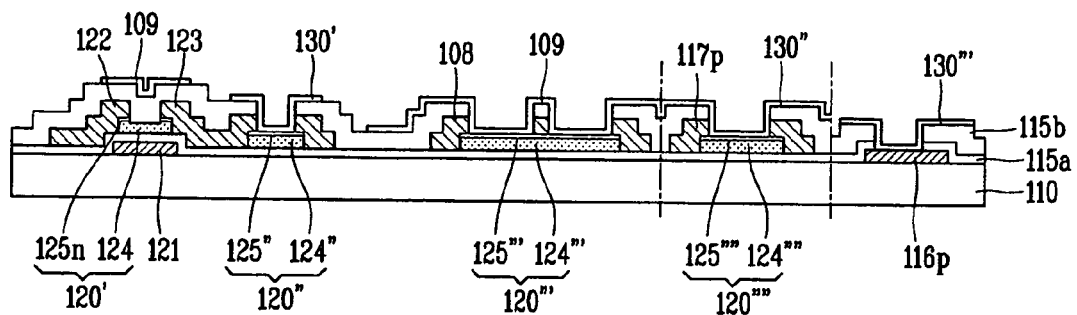
Figure 6E:
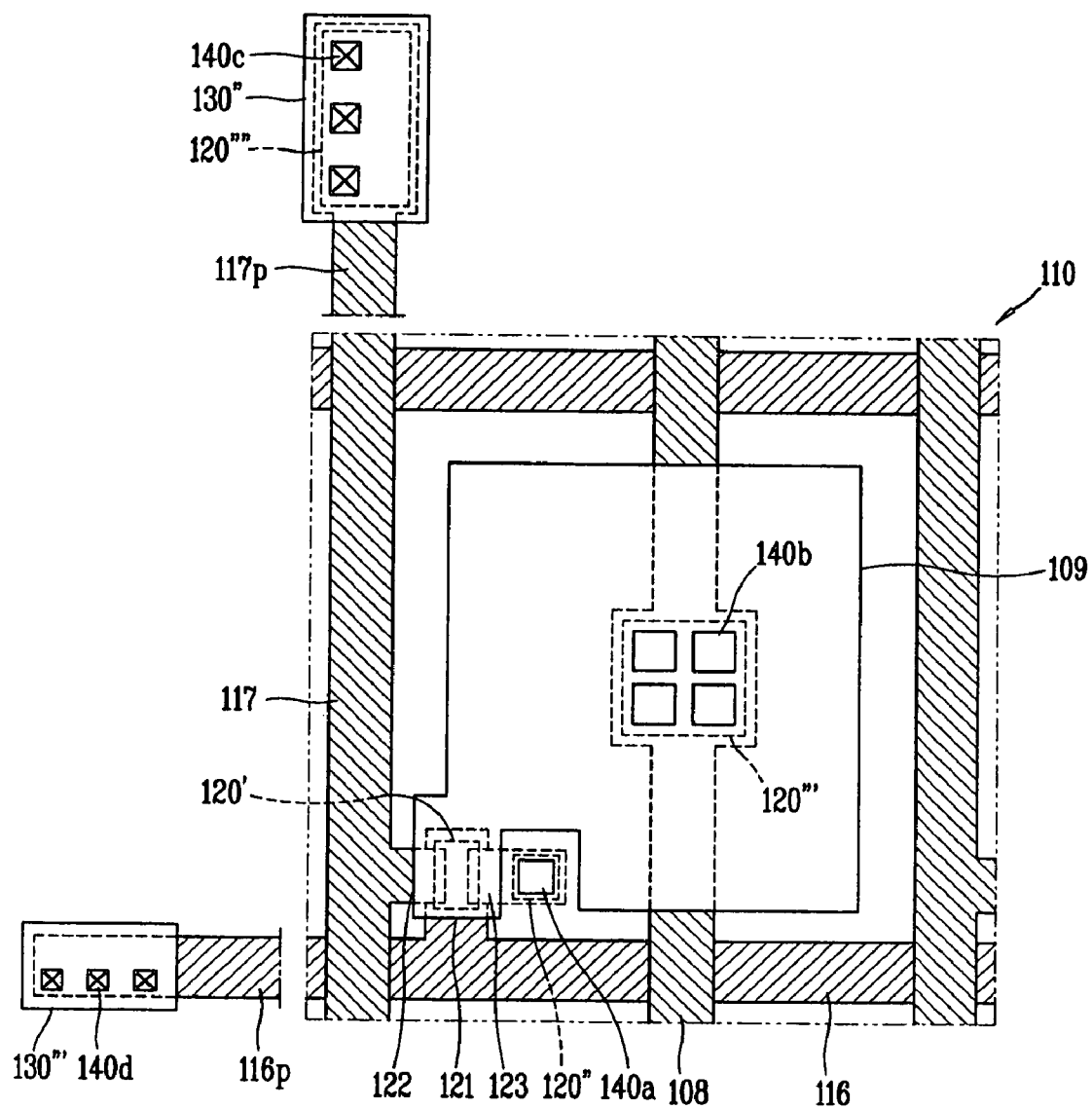

With reference to FIGS. 5E and 6E, a third conductive film made of a transparent conductive material is formed on the entire surface of the array substrate 110 and then selectively removed through a photolithography process (a fifth masking process) to form a first connection electrode 130' formed of the third conductive film and electrically connected with the side of the drain electrode 123 via the first contact hole 140a and the storage electrode 109 electrically connected with the side of the ground line 108 via the plurality of second contact holes 140b.

In addition, as the third conductive film is selectively removed through the fifth masking process, there are formed a second connection electrode 130" electrically connected with the side of the data pad line 117p via the plurality of third contact holes 140c and a third connection electrode 130'" electrically connected with the gate pad line 116p via the plurality of fourth contact holes 140d.

Here, the third conductive film may be formed as a transparent conductive film made of indium tin oxide (ITO), tin oxide (TO), indium zinc oxide (IZO), indium tin zinc oxide (ITZO), or the like, in order to form the storage electrode 109 and the first to third connection electrodes 130' to 130'" within the pixel area.

Figure 5F:
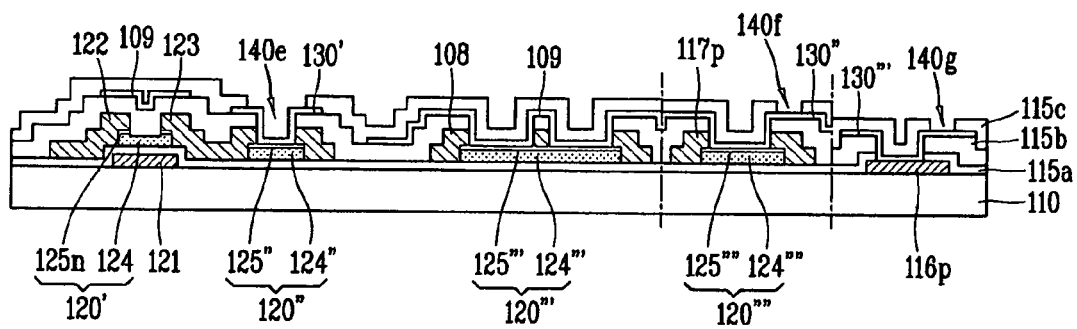
Figure 6F:
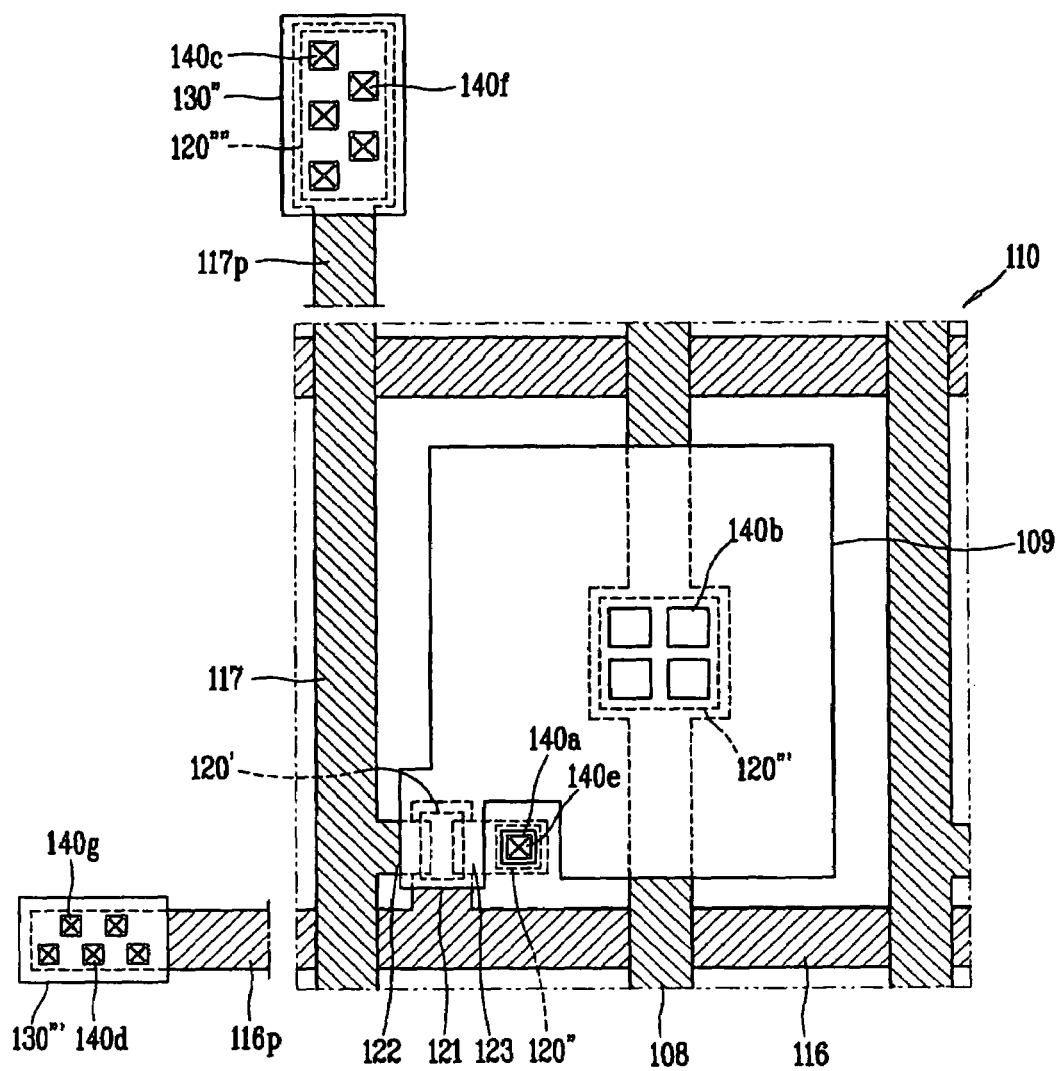

With reference to FIGS. 5F and 6F, a third insulating layer 115c is formed on the entire surface of the array substrate 110 with the storage electrode 109 and the first to third connection electrodes 130' to 130'" formed thereon, and then, a portion of the third insulating layer 115c is selectively removed through a photolithography process (a sixth masking process) to form a fifth contact hole 140e exposing a portion of the first connection electrode 130'.

In addition, as the portion of the third insulating layer 115c is selectively removed through the sixth masking process, there are formed a plurality of sixth contact holes 140f exposing a portion of the second connection electrode 130" and a plurality of seventh contact holes 140g exposing a portion of the third connection electrode 130'''.

Figure 5G:
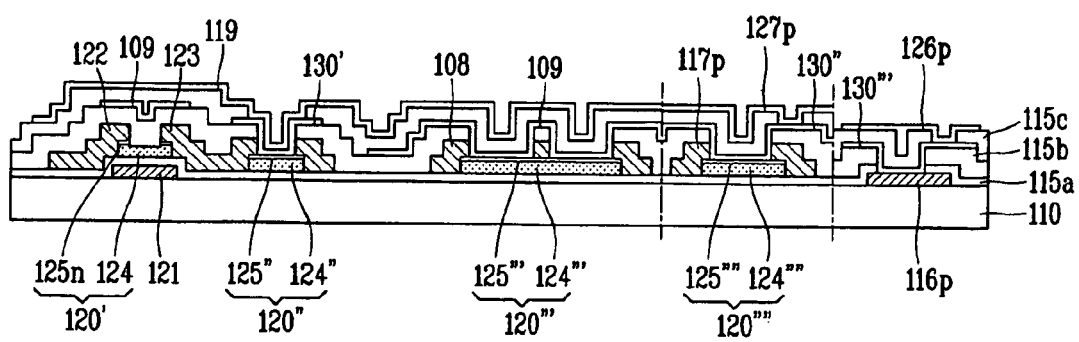
Figure 6G:
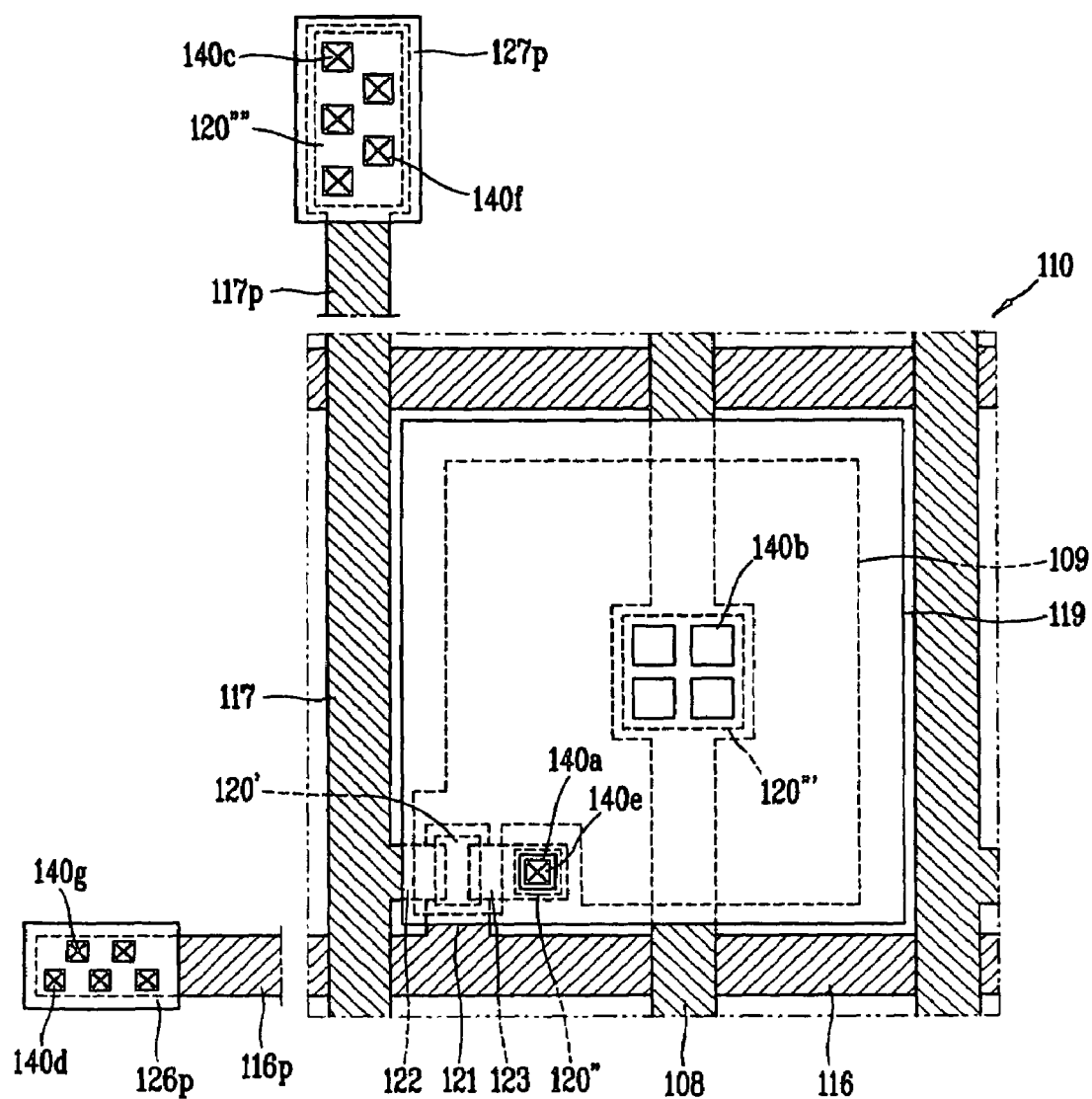

With reference to FIGS. 5G and 6G, a fourth conductive film formed of a transparent conductive material is formed on the entire surface of the array substrate 110 and then selectively removed through a photolithography process (a seventh masking process) to form the charge collecting electrode 119 electrically connected with the drain electrode 123 via the fifth contact hole 140e and the first connection electrode 130'.

Also, as the fourth conductive film is selectively removed through the seventh masking process, there are formed, respectively, the data pad electrode 127p and the gate pad electrode 126p electrically connected with the data pad line 117p and the gate pad line 116p via the plurality of sixth contact holes 140f, the second connection electrode 130", the seventh contact hole 140g and the third connection electrode 130''' at the data pad part and the gate pad part of the array substrate 110.

In this case, the fourth conductive film may be formed as a transparent conductive film made of indium tin oxide (ITO), tin oxide (TO), indium zinc oxide (IZO), indium tin zinc oxide (ITZO), or the like, in order to form the charge collecting electrode 119, the data pad electrode 127p and the gate pad electrode 126p.

Thereafter, a follow-up process (not shown) is performed in which a photosensitive material is coated on the entire surface of the array substrate. The photosensitive material is used as a converter that receives an external signal and converts it into an electrical signal and made of a compound of amorphous selenium.

Also, an x-ray photosensitive material which has a small dark conductivity is sensitive to an external signal and especially high x-ray photoconductivity such as HgI2, PbO, CdTe, CdSe, thallium bromide, cadmium sulfide, or the like, may be used.

The operation of the digital x-ray detector will now be described.

When the photosensitive material is exposed to x-ray light, electron-hole pairs are internally formed, and at this time, a strong DC voltage is applied to the upper electrodes to allow electrons or holes of the electron-hole pairs to be collected to the charge collecting electrode.

The electrons or holes collected by the charge collecting electrode is stored in the form of charges in the storage capacitor, and when a signal is applied to the gate electrode of the TFT, the charges stored in the storage capacitor can be emitted to an external driving circuit to express an image.

If a charge exists in the storage capacitor even after a switching operation is finished, the residual charge existing at the storage capacitor can be removed through the ground line that is in contact with the storage capacitor It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for fabricating a digital x-ray detector, comprising:
   providing a substrate having a pixel part, a data pad part and a gate pad part;
   forming a gate electrode and a gate line at the pixel part of the substrate;
   forming a first insulating layer on the substrate;
   forming a first semiconductor layer at an upper portion of the gate electrode; and
   forming second to fourth semiconductor layers at a drain electrode area, a pixel area and a data pad part, respectively;
   forming a source electrode, a drain electrode and a data line crossing the gate line to define the pixel area at the pixel part of the substrate such that a portion of the drain electrode is positioned on the second semiconductor layer;
   forming a ground line such that the ground line is arranged in one direction at the pixel area of the substrate so as to be commonly grounded with an adjacent pixel and a portion of the ground line is positioned on the third semiconductor layer;
   forming a second insulating layer on the substrate;
   selectively removing portions of the drain electrode and the second insulating layer to form a first contact hole exposing a portion of the first semiconductor layer and selectively removing portions of the ground line and the second insulating layer to expose a plurality of second contact holes;
   forming a first connection electrode electrically connected with the side of the drain electrode via the first contact hole and forming a storage electrode electrically connected with the side of the ground line via the plurality of second contact holes;
   forming a third insulating layer on the substrate;
   selectively removing a portion of the third insulating layer to form a fifth contact hole exposing a portion of the first connection electrode;
   forming a charge collecting electrode electrically connected with the first connection electrode via the fifth contact hole and having a portion overlapping with the storage electrode to form a storage capacitor;
   forming a light conductive film on the substrate; and
   forming an upper electrode on the light conductive film.

2. The method of claim 1, wherein the first to fourth semiconductor layers are formed by stacking an amorphous silicon thin film pattern and an n+ amorphous silicon thin film pattern.

3. The method of claim 1, further comprising:
   forming a data pad line such that the data pad line is positioned on the fourth semiconductor layer of the data pad part.

4. The method of claim 3, wherein the source electrodes, drain electrodes, the data line, the ground line and the data pad line are formed through a masking process.

5. The method of claim 3, further comprising:
   selectively removing portions of the second insulating layer and the data pad line to form a plurality of third contact holes exposing a portion of the third semiconductor layer.

6. The method of claim 5, further comprising:
   forming a second connection electrode electrically connected with the side of the data pad line via the plurality of third contact holes.

7. The method of claim 6, further comprising:
selectively removing a portion of the third insulating layer to form a plurality of sixth contact holes exposing a portion of the second connection electrode.

8. The method of claim 7, further comprising:
forming a data pad electrode electrically connected with the second connection electrode via the plurality of sixth contact holes.

9. The method of claim 1, further comprising:
forming a gate pad line at the gate pad part of the substrate.

10. The method of claim 9, further comprising:
selectively removing portions of the first and second insulating layers to form a plurality of fourth contact holes exposing a portion of the gate pad line.

11. The method of claim 10, further comprising:
forming a third connection electrode electrically connected with the gate pad line via the plurality of fourth contact holes.

12. The method of claim 11, further comprising:
selectively removing a portion of the third insulating layer to form a plurality of seventh contact holes exposing a portion of the third connection electrode.

13. The method of claim 12, further comprising:
forming a gate pad electrode electrically connected with the third connection electrode via the plurality of seventh contact holes.

14. A digital x-ray detector comprising:
a substrate having a pixel part, a data pad part and a gate pad part;
a gate electrode and a gate line formed at the pixel part of the substrate;
a first insulating layer formed on the substrate;
first to fourth semiconductor layers formed at an upper portion of the gate electrode, a drain electrode area, a pixel area, and the data pad part, respectively;
a source electrode formed at the pixel part of the substrate, a drain electrode having a portion positioned on the second semiconductor layer, and a data line crossing the gate line to define the pixel area;
a ground line arranged in one direction at the pixel area of the substrate, commonly grounded with an adjacent pixel and having a portion positioned on the third semiconductor layer;
a second insulating layer formed on the substrate;
a first contact hole formed by selectively removing the second insulating layer and a portion of the drain electrode and exposing a portion of the first semiconductor layer;
a plurality of second contact holes formed by selectively removing portions of the ground line and the second insulating layer and exposing a portion of the second semiconductor layer;
a first connection electrode electrically connected with the side of the drain electrode via the first contact hole and a storage electrode electrically connected with the side of the ground line via the plurality of second contact holes;
a third insulating layer formed on the substrate;
a fifth contact hole formed by selectively removing a portion of the third insulating layer and exposing a portion of the first connection electrode;
a charge collecting electrode electrically connected with the first connection electrode via the fifth contact hole and having a portion overlapping with the storage electrode to form a storage capacitor;
a light conductive film formed on the substrate; and
an upper electrode formed on the light conductive film.

15. The detector of claim 14, wherein the first to fourth semiconductor layers are formed by stacking an amorphous silicon thin film pattern and an n+ amorphous silicon thin film pattern.

16. The detector of claim 14, further comprising:
a data pad line formed at the data pad part such that the data pad line is positioned on the fourth semiconductor layer.

17. The detector of claim 16, further comprising:
a plurality of third contact holes formed by selectively removing portions of the second insulating layer and the data pad line to expose a portion of the third semiconductor layer.

18. The detector of claim 17, further comprising:
a second connection electrode electrically connected with the side of the data pad line via the plurality of third contact holes.

19. The detector of claim 18, further comprising:
a plurality of sixth contact holes formed by selectively removing a portion of the third insulating layer to expose a portion of the second connection electrode.

20. The detector of claim 19, further comprising:
a data pad electrode electrically connected with the second connection electrode via the plurality of sixth contact holes.

21. The detector of claim 14, further comprising:
a gate pad line formed at the gate pad part of the substrate.

22. The detector of claim 21, further comprising:
a plurality of fourth contact holes formed by selectively removing portions of the first and second insulating layers to expose a portion of the gate pad line.

23. The detector of claim 22, further comprising:
a third connection electrode electrically connected with the gate pad line via the plurality of fourth contact holes.

24. The detector of claim 23, further comprising:
a plurality of seventh contact holes formed by selectively removing a portion of the third insulating layer to expose a portion of the third connection electrode.

25. The detector of claim 24, further comprising:
a gate pad electrode electrically connected with the third connection electrode via the plurality of seventh contact holes.

* * * * *

UNITED STATES PATENT AND TRADEMARK OFFICE
CERTIFICATE OF CORRECTION

| | | |
|---|---|---|
| PATENT NO. | : 7,829,861 B2 | Page 1 of 1 |
| APPLICATION NO. | : 12/289466 | |
| DATED | : November 9, 2010 | |
| INVENTOR(S) | : Ju-Han Kim | |

It is certified that error appears in the above-identified patent and that said Letters Patent is hereby corrected as shown below:

Please correct item no. 73 on the Title Page of the patent. The assignee should be:

LG Display Co., Ltd.

Signed and Sealed this
Twenty-eighth Day of December, 2010

David J. Kappos
*Director of the United States Patent and Trademark Office*